(12) United States Patent
Yamada et al.

(10) Patent No.: US 12,046,447 B2
(45) Date of Patent: Jul. 23, 2024

(54) MULTI-CHARGED-PARTICLE-BEAM WRITING METHOD, MULTI-CHARGED-PARTICLE-BEAM WRITING APPARATUS, AND COMPUTER-READABLE RECORDING MEDIUM

(71) Applicant: NuFlare Technology, Inc., Yokohama (JP)

(72) Inventors: Taku Yamada, Ayase (JP); Takahito Nakayama, Chigasaki (JP)

(73) Assignee: NuFlare Technology, Inc., Yokohama (JP)

( * ) Notice: Subject to any disclaimer, the term of this patent is extended or adjusted under 35 U.S.C. 154(b) by 174 days.

(21) Appl. No.: 17/885,774

(22) Filed: Aug. 11, 2022

(65) Prior Publication Data

US 2023/0078311 A1    Mar. 16, 2023

(30) Foreign Application Priority Data

Sep. 14, 2021 (JP) ................................. 2021-149609

(51) Int. Cl.
*H01J 37/304* (2006.01)
*G03F 7/00* (2006.01)
(Continued)

(52) U.S. Cl.
CPC ...... *H01J 37/3045* (2013.01); *G03F 7/70383* (2013.01); *G03F 7/70525* (2013.01);
(Continued)

(58) Field of Classification Search
CPC .. H01J 37/3045; H01J 37/045; H01J 37/1472; H01J 37/3177; G03F 7/70383; G03F 7/70525; G03F 7/70558
See application file for complete search history.

(56) References Cited

U.S. PATENT DOCUMENTS 9,653,262 B2   5/2017  Iizuka et al.
10,867,774 B2  12/2020  Iizuka
(Continued)

FOREIGN PATENT DOCUMENTS

JP    2016-063149 A    4/2016
JP    2017-028284 A    2/2017
JP    2019-029484 A    2/2019

*Primary Examiner* — Sean M Luck
(74) *Attorney, Agent, or Firm* — Oblon, McClelland, Maier & Neustadt, L.L.P.

(57) ABSTRACT

In one embodiment, a multi-charged-particle-beam writing method includes dividing a data path into a plurality of first blocks based on at least either one of each of a plurality of input/output circuits and a plurality of wiring groups, and calculating a first shift amount for multiple beams for each of the plurality of first blocks. The data path is for inputting control data to a cell array on a blanking aperture array substrate. The control data is for controlling ON/OFF of each beam of the multiple beams. Each of the plurality of wiring groups includes a plurality of pieces of wiring connected to the plurality of input/output circuits and grouped together based on inter-wiring distance. The first shift amount is due to at least one of an electric field and a magnetic field for each of the plurality of first blocks. An irradiation position or a dose of the multiple beams is corrected based on the first shift amount, and irradiation is performed.

15 Claims, 5 Drawing Sheets

(51) Int. Cl.
*H01J 37/04* (2006.01)
*H01J 37/147* (2006.01)
*H01J 37/317* (2006.01)

(52) U.S. Cl.
CPC ........ *G03F 7/70558* (2013.01); *H01J 37/045* (2013.01); *H01J 37/1472* (2013.01); *H01J 37/3177* (2013.01); *H01J 2237/30438* (2013.01)

(56) References Cited

U.S. PATENT DOCUMENTS

| | | | |
|---|---|---|---|
| 2016/0086764 A1* | 3/2016 | Iizuka | H01J 37/3177 250/492.3 |
| 2016/0093466 A1* | 3/2016 | Mizoguchi | H01J 37/28 315/14 |

* cited by examiner

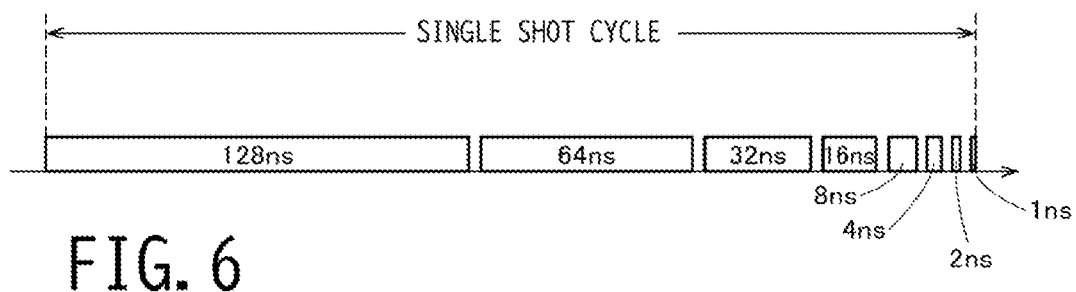
FIG. 6
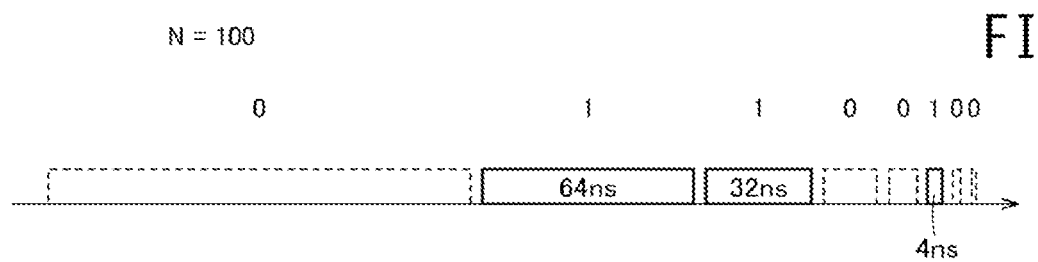
FIG. 7
FIG. 8
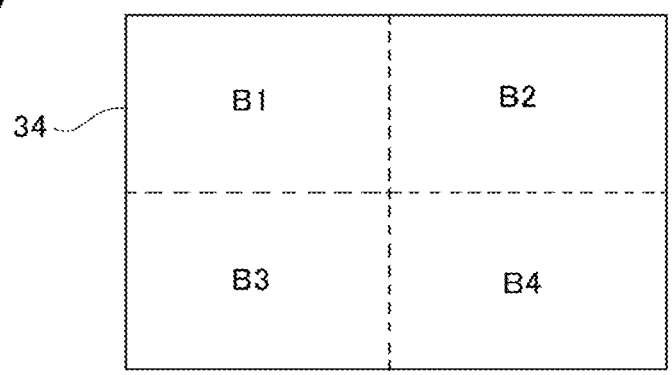

MULTI-CHARGED-PARTICLE-BEAM WRITING METHOD, MULTI-CHARGED-PARTICLE-BEAM WRITING APPARATUS, AND COMPUTER-READABLE RECORDING MEDIUM

CROSS REFERENCE TO RELATED APPLICATION

This application is based upon and claims benefit of priority from the Japanese Patent Application No. 2021-149609, filed on Sep. 14, 2021, the entire contents of which are incorporated herein by reference.

FIELD

The present invention relates to a multi-charged-particle-beam writing method, a multi-charged-particle-beam writing apparatus, and a computer-readable recording medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

Writing apparatuses employing multiple beams allow for radiation of a large number of beams at once in comparison to writing with a single beam, leading to significantly improved throughput. One example of multi-beam writing apparatuses employs a blanking aperture array substrate. With such a multi-beam writing apparatus, for example, an electron beam emitted from a single electron gun is passed through a shaping aperture array substrate having a plurality of apertures to thereby form multiple beams (a plurality of electron beams). The multiple beams pass through the corresponding blankers of the blanking aperture array substrate. The blanking aperture array substrate includes an electrode pair for individually deflecting a beam, with a beam passage aperture provided between the electrode pair. Each electrode of the electrode pair (blanker) is controlled to have either the same potential or a different potential to thereby provide blanking deflection to the passing electron beam. An electron beam deflected by the blanker is blocked, and an electron beam that is not deflected is radiated onto a substrate.

Multi-beam writing typically involves a large total beam current, and thus susceptible to deterioration of writing accuracy due to the Coulomb effects. For instance, inter-electron repulsion can lead to beam position displacement or de-focusing on a sample surface. Techniques for mitigating beam position displacement due to the Coulomb effects have been proposed. One such exemplary technique involves dividing the blanking aperture array substrate into a plurality of blocks, preliminarily creating a table that represents the relationship between blanking density (density of ON beams) and the amount of position displacement for each individual block, and correcting for, for example, shift or distortion based on parameters acquired from the table (see, for example, Japanese Unexamined Patent Application Publication No. 2017-028284).

With the above-mentioned technique involving use of a table, increasing the accuracy of correction requires, for example, increasing the number of blocks into which the blanking aperture array substrate is to be divided, or increasing the number of conditions on blanking density. Increasing the number of conditions, however, makes it more troublesome to create a table, and also increases the time required for acquiring parameters from the table.

Causes of beam position displacement include not only the effects of inter-beam Coulomb interaction, but also the influence of an electric field from electric charge stored in capacitances in a control circuit mounted to the blanking aperture array substrate, or the influence of a magnetic field due to the drive current for the control circuit. It has been difficult with conventional techniques to correct the beam position displacement. Such influence of an electric field or magnetic field has been found to vary with the individual positions of input/output circuits on the control circuit, or with the individual positions of wiring connected to the input/output circuits.

BRIEF DESCRIPTION OF THE DRAWINGS

FIG. 6 illustrates exemplary irradiation steps within one shot cycle.

FIG. 7 illustrates exemplary beam ON timing.

FIG. 8 illustrates an exemplary division of a blanking aperture array substrate into blocks.

DETAILED DESCRIPTION

In one embodiment, a multi-charged-particle-beam writing method includes dividing a data path into a plurality of first blocks based on at least either one of each of a plurality of input/output circuits and a plurality of wiring groups, and calculating a first shift amount for multiple beams for each of the plurality of first blocks. The data path is for inputting control data to a cell array on a blanking aperture array substrate. The control data is for controlling ON/OFF of each beam of the multiple beams. Each of the plurality of wiring groups includes a plurality of pieces of wiring connected to the plurality of input/output circuits and grouped together based on inter-wiring distance. The first shift amount is due to at least one of an electric field and a magnetic field for each of the plurality of first blocks. An irradiation position or a dose of the multiple beams is corrected based on the first shift amount, and irradiation is performed with each beam of the multiple beams.

Hereinafter, an embodiment of the present invention will be described based on the drawings. In the present embodiment, a configuration will be described, which uses an electron beam as an example of a charged particle beam.

However, the charged particle beam is not limited to an electron beam, and may be an ion beam or the like.

Figure 1:
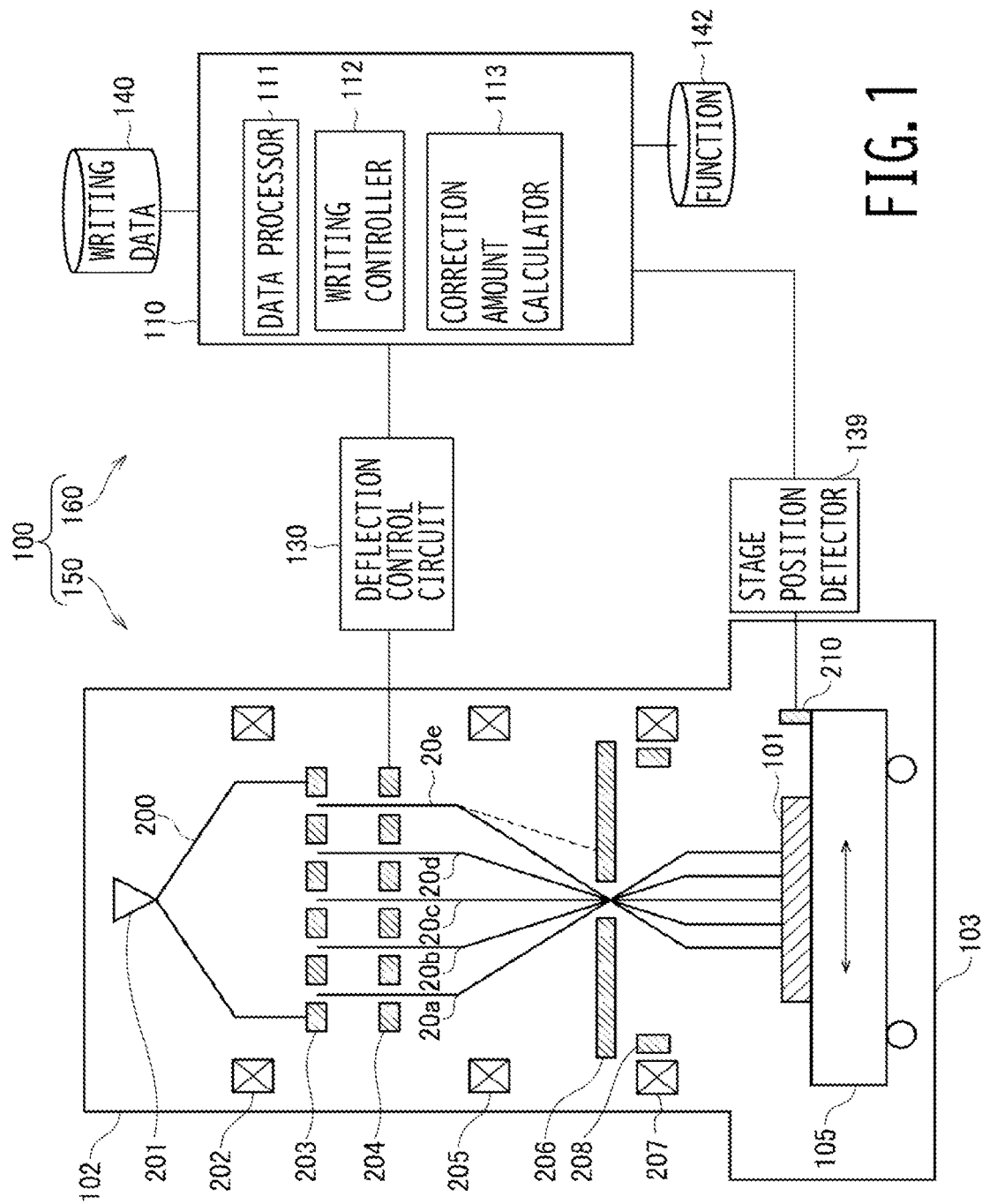
FIG. 1 schematically illustrates a multi-charged-particle-beam writing apparatus according to an embodiment of the present invention.

FIG. 1 schematically illustrates the configuration of a writing apparatus according to an embodiment. As illustrated in FIG. 1, a writing apparatus 100 includes a writer 150, and a controller 160. The writing apparatus 100 is an exemplary multi-charged-particle-beam writing apparatus. The writer 150 includes an electron column 102, and a writing chamber 103. The following components are disposed in the electron column 102: an electron gun 201, an illumination lens 202, a shaping aperture array member 203, a blanking aperture array substrate 204, a demagnification lens 205, a limiting aperture member 206, an objective lens 207, and a deflector 208. An anastigmatic correction coil or other components (not illustrated) may be disposed in the electron column 102.

An XY stage 105 is disposed in the writing chamber 103. A substrate 101 on which to perform writing is disposed on the XY stage 105. The substrate 101 has an upper surface coated with a resist that is to be exposed to electron beams. In one example, the substrate 101 is a substrate (mask blank) that is to be processed into a mask, or a semiconductor substrate (silicon wafer) that is to be processed into a semiconductor device. In another example, the substrate 101 may be a mask blank that has been coated with a resist and on which nothing has been written. A mirror 210 for measuring stage position is disposed on the XY stage 105.

The controller 160 includes a control computer 110, a deflection control circuit 130, a stage position detector 139, and memory units 140 and 142. The memory unit 140 receives and stores writing data externally input to the memory unit 140. For the writing data, typically, information on graphic patterns used for writing is defined. Specifically, for each graphic pattern, a graphic code, coordinates, size, and other information are defined. The memory unit 142 stores function data. Functions represented by the function data will be described later.

The control computer 110 includes a data processor 111, a writing controller 112, and a correction amount calculator 113. Each component of the control computer 110 may be implemented by hardware such as an electrical circuit, or may be implemented by software such as a program to be executed by the control computer 110. Alternatively, each component of the control computer 110 may be implemented by a combination of hardware and software.

The stage position detector 139 radiates laser light, receives the reflection from the mirror 210, and detects the position of the XY stage 105 based on the principle of laser interferometry.

Figure 2:
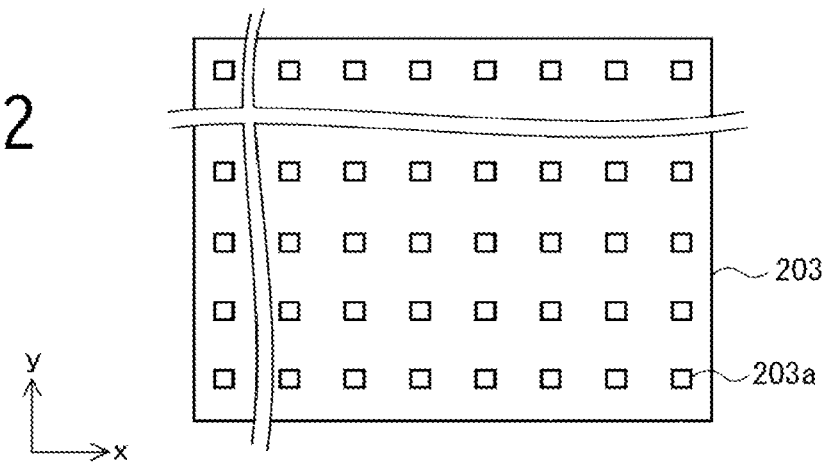
FIG. 2 is a plan view of a shaping aperture array component.

FIG. 2 conceptually illustrates the configuration of the shaping aperture array member 203. As illustrated in FIG. 2, the shaping aperture array member 203 includes a plurality of apertures 203a arranged with a predetermined pitch in the vertical direction (y-direction) and the horizontal direction (x-direction). The apertures 203a are formed as, for example, rectangles or circles with the same (substantially the same) dimensions.

An electron beam 200 emitted from the electron gun 201 (emitter) is caused by the illumination lens 202 to illuminate the entire shaping aperture array member 203 substantially perpendicularly. The electron beam 200 illuminates a region including all of the apertures 203a. Part of the electron beam 200 passes through the apertures 203a of the shaping aperture array member 203, and the remainder of the beam is blocked by the shaping aperture array member 203. As the electron beam 200 passes through the apertures 203a, for example, a plurality of electron beams (multiple beams) 20a to 20e with a rectangular shape are formed.

The blanking aperture array substrate 204 has beam passage holes at locations corresponding to the apertures 203a of the shaping aperture array member 203. A blanker 50 (see FIG. 5) including a set of two electrodes 51 and 52 forming an electrode pair is disposed at each passage hole. With the electrode 52 grounded and maintained at the ground potential, the other electrode 51 is switched to the ground potential or a potential other than the ground potential, so that the deflection of a beam passing through each passage hole is switched ON and OFF to thereby control blanking.

To switch a beam ON, the opposing electrodes 51 and 52 of the blanker 50 are controlled to have the same potential, and thus the blanker 50 does not deflect the beam. To switch a beam OFF, the opposing electrodes 51 and 52 of the blanker 50 are controlled to have different potentials, and thus the blanker 50 deflects the beam. As a plurality of blankers 50 each provide blanking deflection to the corresponding one of multiple beams that have passed through the apertures 203a of the shaping aperture array member 203, each beam can be controlled to the OFF state.

After passing through the blanking aperture array substrate 204, the multiple beams 20a to 20e are demagnified by the demagnification lens 205 before travelling toward a central aperture defined in the limiting aperture member 206.

At this time, beams to be controlled to the beam OFF state are deflected by the blanker 50, and follow a trajectory in which the beams travel outside the aperture of the limiting aperture member 206. The beams are thus blocked by the limiting aperture member 206. In contrast, beams to be controlled to the beam ON state are not deflected by the blanker 50, and thus pass through the aperture of the limiting aperture member 206. At this time, these beams ideally pass through the same point. The trajectory of each beam is adjusted by means of an alignment coil (not illustrated) such that the above-mentioned point is located inside the aperture at the center of the limiting aperture member 206. In this way, the deflection to be provided by the blanker 50 is switched ON/OFF to control blanking, and ON/OFF of each beam is thus controlled.

The limiting aperture member 206 blocks the beams that have been deflected by the blankers 50 and thus controlled to the OFF state. One shot of multiple beams is formed by beams that have been formed during the period of time from beam ON to beam OFF and that have passed through the limiting aperture member 206.

The multiple beams that have passed through the limiting aperture member 206 are focused by the objective lens 207 to provide a pattern image at a desired demagnification ratio. The beams (the multiple beams as a whole) that have passed through the limiting aperture member 206 are collectively deflected in the same direction by the deflector 208 so as to irradiate a desired position on the substrate 101.

With the XY stage 105 in continuous movement, at least while the substrate 101 is irradiated with beams, the beam irradiation position on the substrate 101 is controlled by means of the deflector 208 so as to follow the movement of the XY stage 105. Ideally, the multiple beams radiated at a time are arranged on the substrate 101 at a pitch that is equal to the arrangement pitch of the apertures 203a of the shaping aperture array member 203 multiplied by the desired demagnification ratio mentioned above.

Figure 3:
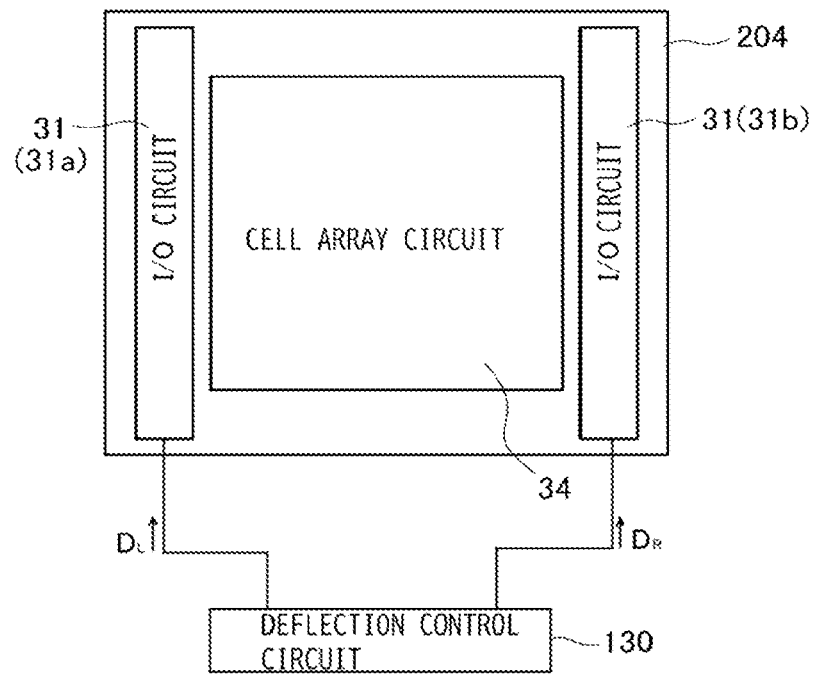
FIG. 3 schematically illustrates the configuration of a blanking aperture array substrate.

As illustrated in FIG. 3, the blanking aperture array substrate 204 for controlling blanking of each beam of the multiple beams includes an input/output circuit 31 (31*a*, 31*b*), and a cell array circuit 34 with an array of cells each having a blanking aperture and an electrode. The input/output circuit 31 receives a control signal from the deflection control circuit 130.

The cell array circuit 34 is disposed in the central portion of the blanking aperture array substrate 204, with two input/output circuits 31*a* and 31*b* disposed with the cell array circuit 34 therebetween. The data path for a control signal to be provided from the deflection control circuit 130 to the blanking aperture array substrate 204 is divided into two separate data paths $D_L$ and $D_R$.

Figure 4:
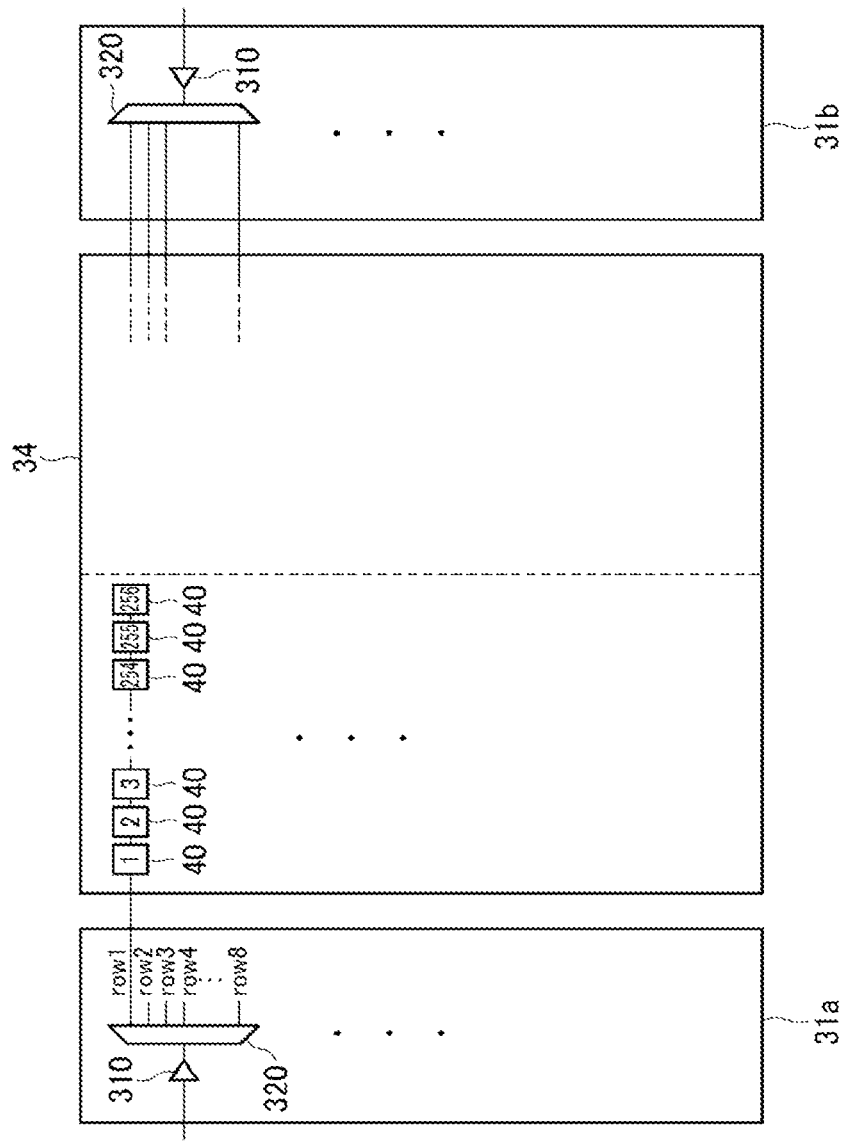
FIG. 4 illustrates the configurations of input/output circuits and the configuration of a cell array circuit.

As illustrated in FIG. 4, the cell array circuit 34 includes a plurality of cells each defining an individual blanking mechanism 40. A single individual blanking mechanism 40 corresponds to a single blanker 50. The input/output circuit 31 converts a control signal received from the deflection control circuit 130 into a beam ON/OFF signal, and then outputs the beam ON/OFF signal to the cell array circuit 34. For example, the input/output circuit 31*a* outputs a beam ON/OFF signal to each of the individual blanking mechanisms 40 disposed in one half of the cell array circuit 34, and the input/output circuit 31*b* outputs a beam ON/OFF signal to each of the individual blanking mechanisms 40 disposed in the other half of the cell array circuit 34.

The input/output circuit 31 is provided with a plurality of selectors 320 (demultiplexers). Each selector 320 receives, via an amplifier 310, irradiation-time control data defining the irradiation time for each beam shot, and outputs a beam ON/OFF signal through the corresponding output line. A plurality of individual blanking mechanisms 40 are connected in series with each output line.

For example, each selector 320 has eight output lines, rows 1 to 8, and each output line is connected with 256 individual blanking mechanisms 40. Disposing 64 selectors 320 in each of the input/output circuits 31*a* and 31*b* makes it possible to transfer a beam ON/OFF signal to each of 512×512 individual blanking mechanisms 40 within the cell array circuit 34.

Each individual blanking mechanism 40 to which the input/output circuit 31*a* outputs a beam ON/OFF signal, and each individual blanking mechanism 40 to which the input/output circuit 31*b* outputs a beam ON/OFF signals may not necessarily be disposed as illustrated in FIG. 4. For example, each output line from the input/output circuit 31*a*, and each output line from the input/output circuit 31*b* may be disposed alternately. Alternatively, each individual blanking mechanism 40 to which the input/output circuit 31*a* outputs a beam ON/OFF signal, and each individual blanking mechanism 40 to which the input/output circuit 31*b* outputs a beam ON/OFF signals may be disposed alternately.

Figure 5:
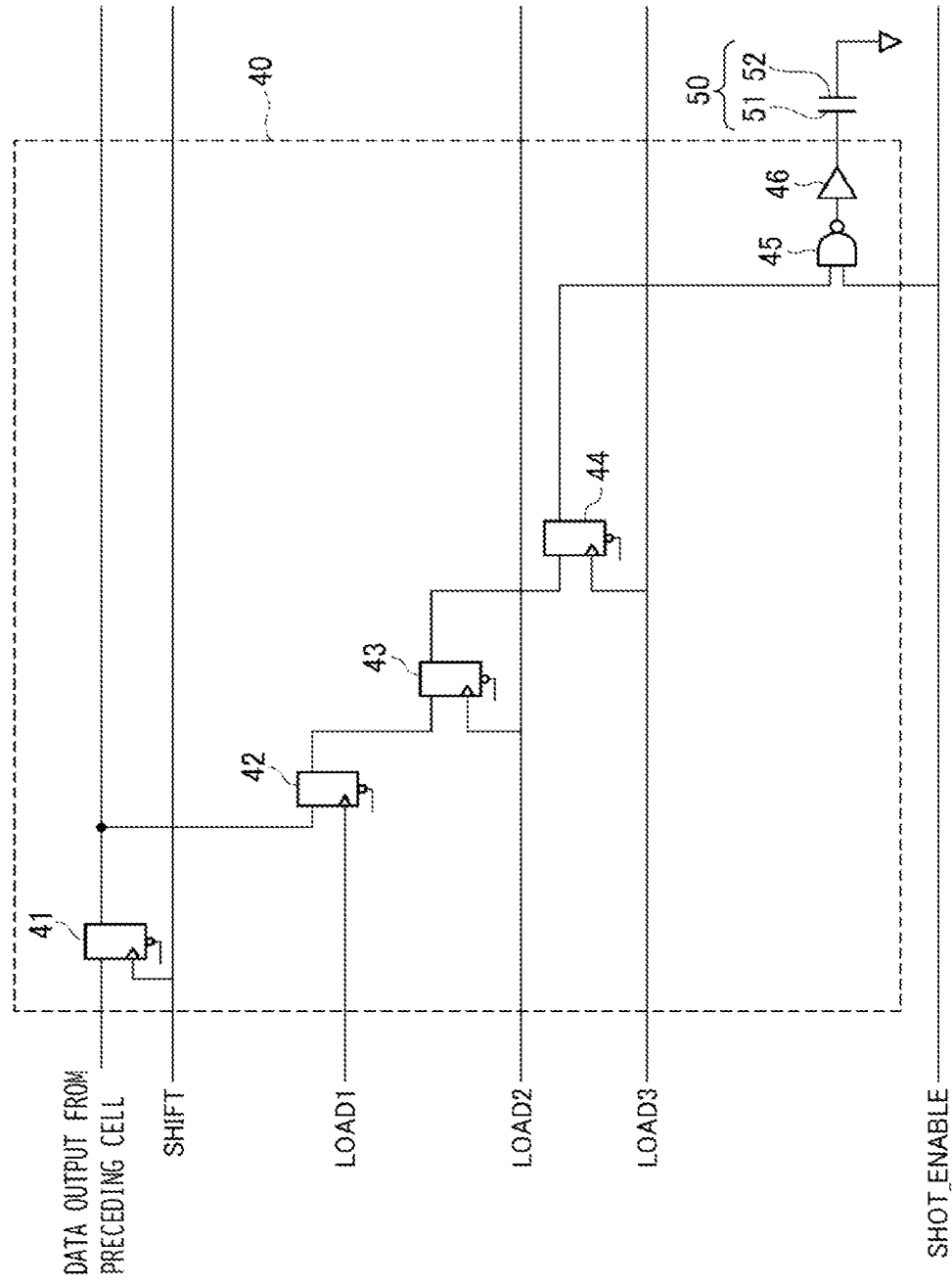
FIG. 5 schematically illustrates the configuration of each individual blanking mechanism.

As illustrated in FIG. 5, each individual blanking mechanism 40 includes a shift register 41, a pre-buffer 42, a buffer 43, a data register 44, a NAND circuit 45, and an amplifier 46. The shift register 41 transfers, in accordance with a clock signal (SHIFT), data output from the shift register of the preceding cell to the shift register of the succeeding cell.

The pre-buffer 42 stores, in accordance with a clock signal (LOAD1), a beam ON/OFF signal for the current cell that is output from the shift register 41.

The buffer 43 captures and holds, in accordance with a clock signal (LOAD2), a value output from the pre-buffer 42.

The data register 44 captures and holds, in accordance with a clock signal (LOAD3), a value output from the buffer 43.

The NAND circuit 45 receives an output signal from the data register 44, and a shot enable signal (SHOT_ENABLE). The output signal from the NAND circuit 45 is given to the electrode 51 of the blanker 50 via the amplifier 46 (driver amplifier).

If the output signal from the data register 44, and the shot enable signal are both HIGH, the output of the NAND circuit 45 goes LOW, which causes the electrode 51 and the electrode 52 to have the same potential. Consequently, the blanker 50 does not deflect a beam, and thus the beam is switched ON. If at least either one of the output signal from the data register 44, and the shot enable signal is LOW, the output of the NAND circuit 45 goes HIGH, which causes the electrode 51 and the electrode 52 to have different potentials. Consequently, the blanker 50 deflects a beam, and thus the beam is switched OFF.

The shot enable signal is input to every individual blanking mechanism 40 of the NAND circuit 45. By setting the shot enable signal LOW, all beams can be switched OFF.

With the shot enable signal maintained HIGH, each beam is switched ON/OFF by the output of the data register 44. That is, when the irradiation-time control data is 1 (HIGH), the beam ON/OFF signal becomes ON, and when the irradiation-time control data is 0 (LOW), the beam ON/OFF signal becomes OFF.

In multi-beam writing, a fixed shot cycle determined in accordance with the maximum dose is used. Within one shot cycle, each beam is switched ON for a desired irradiation time, and OFF for the remainder of the time. For example, an irradiation time, T, is divided by the unit of quantization, Δ, to calculate a grayscale value N. The unit of quantization Δ can be set to various values, for example, 1 ns. The grayscale value N converted into a binary number of n digits serves as the irradiation-time control data.

For example, if N=50, then $50=2^5+2^4+2^1$. Thus, when the grayscale value N is converted into a binary number of eight digits, the irradiation-time control data is represented as "00110010". Likewise, if N=100, the irradiation-time control data is represented as "01100100".

The first digit of the irradiation-time control data represents irradiation time 1Δ. The second digit of the irradiation-time control data represents irradiation time 2Δ. The third digit of the irradiation-time control data represents irradiation time 4Δ. The fourth digit of the irradiation-time control data represents irradiation time 8Δ. The fifth digit of the irradiation-time control data represents irradiation time 16Δ. The sixth digit of the irradiation-time control data represents irradiation time 32Δ. The seventh digit of the irradiation-time control data represents irradiation time 64Δ. The eighth digit of the irradiation-time control data represents irradiation time 128Δ.

A single shot cycle is divided into a number of irradiation steps equal to the number of digits (number of bits) n of the irradiation-time control data. Each irradiation step has an irradiation time corresponding to the associated digit. For example, assuming that irradiation is performed in order from the largest digit, and Δ=1 ns, then as illustrated in FIG. 6, the first irradiation step has an irradiation time of 128 ns. The second irradiation step has an irradiation time of 64 ns. The third irradiation step has an irradiation time of 32 ns. The fourth irradiation step has an irradiation time of 16 ns. The fifth irradiation step has an irradiation time of 8 ns. The sixth irradiation step has an irradiation time of 4 ns. The seventh irradiation step has an irradiation time of 2 ns. The eighth irradiation step has an irradiation time of 1 ns.

If N=100, the irradiation-time control data is represented as "01100100". As illustrated in FIG. 7, the corresponding beam is ON at each of the second (64 ns), third (32 ns), and sixth (4 ns) irradiation steps, and OFF at each of the first, fourth, fifth, seventh, and eighth irradiation steps.

As described above by way of example, in multi-beam writing, one shot cycle is divided into a plurality of irradiation steps, and at each irradiation step, the corresponding beam is switched ON/OFF to achieve a desired irradiation time. For example, each of the irradiation steps differs in irradiation time, which is proportional to a power of 2.

In multi-beam writing, the input/output circuits 31a and 31b mounted to the blanking aperture array substrate 204 incorporate various circuits such as a power circuit, a logic circuit, and a switching circuit. In operation, the input/output circuits 31a and 31b receive various currents in addition to control signals from the deflection control circuit. Thus, the beam ON/OFF signal to be delivered from each of the input/output circuits 31a and 31b to each of the output lines, the rows 1 to 8, and the current to be input to each of the input/output circuits 31a and 31b do not have a one-to-one correspondence.

In operation, the input/output circuits 31a and 31b mounted to the blanking aperture array substrate 204 receive various currents. At that time, an electric field from electric charge stored in capacitances placed in each of the input/output circuits 31a and 31b, a magnetic field due to a current in each circuit, or other factors affect the accuracy of beam irradiation position. Accordingly, with the embodiment, a shift amount for each individual block is determined from a circuit current (including currents such as a power current, and an operating current based on a beam ON/OFF signal) that flows from the deflection control circuit 130 to each of the input/output circuits 31a and 31b disposed on the blanking aperture array substrate 204 and that affects an electric field or a magnetic field, and based on the shift amount determined for each individual block, a shift amount for the multiple beams as a whole is determined, and the irradiation position is corrected. At this time, the dose of each beam may be adjusted to adjust the pattern resolving position.

As described above, according to the embodiment, the location of the input/output circuits 31a and 31b that receive, from the deflection control circuit 130, input of a control signal to be delivered to the blanking aperture array substrate 204, or the location of the wiring connected to the input/output circuits 31a and 31b is divided into two separate locations. Accordingly, the circuit current is determined individually for each of two separate blocks corresponding to the individual locations.

Further, for example, the data processor 111 virtually divides the writing region on the substrate 101 into a plurality of mesh regions. Each mesh region is, for example, substantially equal in size to a single beam. Each mesh region serves as a pixel (unit irradiation region). The data processor 111 reads writing data from the memory unit 140, and calculates a pattern area density ρ for each individual pixel by using a pattern defined in the writing data.

Subsequently, the data processor 111 calculates a dose at which to irradiate each pixel with the corresponding beam, by multiplying the pattern area density ρ by a base dose and a correction coefficient used to correct for the proximity effect or other effects. The data processor 111 divides the dose by current density to calculate irradiation time.

Subsequently, the data processor 111 distributes the irradiation time among a plurality of irradiation steps to generate irradiation-time control data. For example, the data processor 111 divides the irradiation time by the unit of quantization to calculate a grayscale value t (irradiation time quantized into an integer). In the example illustrated in FIG. 7, the data processor 111 determines, as irradiation-time control data, a string of ON/OFF flags corresponding to the sequence ($2^7$, $2^6$, $2^5$, $2^4$, $2^3$, $2^2$, $2^1$, $2^0$).

The data processor 111 calculates, in predetermined time units, a data transfer size defined as the number of pieces of data with the value 1 (HIGH) within the irradiation-time control data transmitted from the deflection control circuit 130 to the input/output circuit 31a. Further, the data processor 111 calculates, in predetermined time units, the data transfer size defined as the number of pieces of data with the value 1 (HIGH) within the irradiation-time control data transmitted from the deflection control circuit 130 to the input/output circuit 31b. The data transfer size may be calculated for all signal lines through which to transfer data, or the data transfer size may be calculated with some of signal lines thinned out. The data transfer size may be determined in predetermined time units, or may be determined based on the data transfer time for each predetermined data division unit. The operating current depends on the transfer size or transfer time of control data mentioned above.

Preliminarily, a data path is divided into blocks (data paths $D_L$ and $D_R$) with each of the input/output circuits 31a and 31b as one block, and for each of the blocks, a circuit current is delivered to the block, and the center of gravity of each ON beam is computed to thereby determine a shift amount. At this time, the division into blocks may be performed with a group of wiring as one block. The group of wiring is obtained by grouping together, based on inter-wiring distance, a plurality of pieces of wiring connected to these input/output circuits, for example, by grouping together those pieces of wiring that are similar to each other in terms of the inter-wiring distance at the location of data input/output to/from each input/output circuit or in terms of the mean inter-wiring distance. It is to be noted, however, that the wiring may not necessarily be divided into groups by the method mentioned above. A shift amount $X_L$, $Y_L$ is determined as a displacement, from the center in one half region of the cell array circuit 34 where the individual blanking mechanisms 40 that receive beam ON/OFF signals from the input/output circuit 31a are disposed, of the center of gravity of each ON beam within the one half region. Further, a shift amount $X_R$, $Y_R$ is determined as a displacement, from the center in the other half region of the cell array circuit 34 where the individual blanking mechanisms 40 that receive beam ON/OFF signals from the input/output circuit 31b are disposed, of the center of gravity of each ON beam within the other half region.

With a current circuit I as a variable, functions f and g for determining a shift amount are determined. The functions are determined as follows: $X_{L/R}=f(I_{L/R})$, and $Y_{L/R}=g(I_{L/R})$. Data representing the functions f and g is stored into the memory unit 142.

During a write process, the correction amount calculator 113 determines a shift amount $X_{L/R}$, $Y_{L/R}$ by using the circuit current calculated by the data processor 111, and the functions extracted from the memory unit 142.

The correction amount calculator 113 combines the shift amounts $X_L$ and $X_R$ determined for each individual block to thereby calculate a shift amount X in the x-direction for the blanking aperture array substrate as a whole. Further, the correction amount calculator 113 combines the shift amounts $Y_L$ and $Y_R$ determined for each individual block to thereby calculate a shift amount Y in the y-direction for the blanking aperture array substrate as a whole.

The combination method is not limited to any particular method. In one example, the shift amount X can be calculated by a linear combination such as $X=aX_L+bX_R$. In another example, the maximum value (the larger value) of the shift amounts $X_L$ and $X_R$ may be determined as the shift amount X. In still another example, the average of the shift amounts $X_L$ and $X_R$ may be determined as the shift amount X.

The correction amount calculator 113 calculates, from the shift amount X, Y determined for the blanking aperture array substrate as a whole, the correction amount for cancelling the shift amount.

The deflection control circuit 130 controls, based on the calculated correction amount, the amount of deflection to be provided by the deflector 208. The deflection control circuit 130 thus corrects the irradiation position or dose for the multiple beams.

As described above, according to the embodiment, a shift amount is determined based on the circuit current flowing to each of the input/output circuits 31a and 31b, and the beam irradiation position or dose is corrected. This helps to mitigate the influence, on the accuracy of beam irradiation position, of disturbances such as an electric field from electric charge stored in capacitances in each of the input/output circuits 31a and 31b, or a magnetic field due to the driving current. This leads to improved writing accuracy.

With reference to the above-mentioned embodiment, the circuit current used for shift amount calculation may be a circuit current corresponding to the shot preceding the actual shot, may be a circuit current corresponding to the actual shot, or may be a circuit current corresponding to the shot following the actual shot. Alternatively, two or more of these circuit currents may be used.

If the circuit current used corresponds to the shot preceding the actual shot, it is possible to correct for the influence of the preceding shot. If the circuit current used corresponds to the actual shot, it is possible to perform real-time correction. If the circuit current used corresponds to the shot following the actual shot, it is possible to correct for the influence of the shot that has already been radiated.

The foregoing description of the embodiment is directed to an example of calculating a shift amount by use of a circuit current (a power current and an operating current). The operating current may be calculated based on a control signal for controlling one of data transfer size, data transfer time, and ON/OFF current based on a beam ON/OFF signal.

The foregoing description of the embodiment is directed to an example in which the blanking aperture array substrate is provided with two input/output circuits, and the path of data from the deflection control circuit 130 is divided into two separate data paths. Alternatively, the number of input/output circuits, and the number of data paths from the deflection control circuit 130 may be three or more. Two or more data paths may be connected to a single input/output circuit from the deflection control circuit 130.

The cell array circuit 34 may be divided into a plurality of blocks, and from the dose distribution or blanking distribution determined for each individual block, the displacement of the center of gravity of each ON beam from the center of the block may be determined for each individual block, and a shift amount (second shift amount) obtained by combining displacements corresponding to individual blocks may be added to the shift amount (first shift amount) calculated by use of the functions f and g.

For example, as illustrated in FIG. 8, the cell array circuit 34 is divided into two-by-two, that is, four blocks B1 to B4, and for each of the blocks, a displacement of the center of gravity of each ON beam from the center of the block is determined. The individual blanking mechanisms 40 in all of the blocks B1 to B4 may be evaluated, or part of the individual blanking mechanisms 40, such as every other individual blanking mechanism 40, may be evaluated. Reducing the number of the individual blanking mechanisms 40 to be evaluated leads to reduced computational complexity.

For each of the blocks B1 to B4, a displacement of each ON beam from the center of the block is determined. The displacements determined for individual blocks are combined (such as by linear combination, maximum selection, or averaging) to determine a shift amount (second shift amount).

From the shift amount determined for each individual block, rotation, enlargement, distortion, or other deformations of the overall beam shape of the multiple beams can be identified. Accordingly, the beam shape may be corrected by use of an electrostatic lens or an anastigmatic correction coil.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-charged-particle-beam writing method comprising:
   dividing a data path into a plurality of first blocks based on at least either one of each of a plurality of input/output circuits and a plurality of wiring groups, and calculating a first shift amount for multiple beams for each of the plurality of first blocks, the data path being a path for inputting control data to a cell array on a blanking aperture array substrate, the control data being data for controlling ON/OFF of each beam of the multiple beams, the plurality of wiring groups each including a plurality of pieces of wiring connected to the plurality of input/output circuits and grouped together based on inter-wiring distance, the first shift amount being a shift amount due to at least one of an electric field and a magnetic field for each of the plurality of first blocks; and
   correcting an irradiation position or a dose of the multiple beams based on the first shift amount, and performing irradiation with each beam of the multiple beams.

2. The method according to claim 1, wherein for each of the plurality of first blocks, the first shift amount is calculated based on a circuit current, the circuit current including a power current and an operating current, the operating current being dependent on a transfer size or transfer time of the control data to be transferred to each of the plurality of input/output circuits.

3. The method according to claim 1, further comprising:
   dividing the cell array into a plurality of second blocks, and acquiring a dose distribution or a blanking distribution for each of the plurality of second blocks; and
   calculating a second shift amount for each of the plurality of second blocks from the dose distribution or the blanking distribution,
   wherein the irradiation position or the dose for the multiple beams is corrected based on the first shift amount or the second shift amount, and irradiation with each beam of the multiple beams is performed.

4. The method according to claim 3, wherein a shift amount for the cell array as a whole, and rotation, enlargement, or distortion of a beam shape of the multiple beams are calculated based on the first shift amount or the second shift amount, and the beam shape is corrected.

5. The method according to claim 1, wherein a shift amount for the blanking aperture array substrate as a whole is determined by linear combination of the first shift amount calculated for each of the plurality of first blocks, and the irradiation position or the dose for the multiple beams is corrected based on the determined shift amount.

6. A multi-charged-particle-beam writing apparatus comprising:
   a blanking aperture array substrate including a plurality of blankers, the plurality of blankers each corresponding to each beam of multiple beams and configured to switch each beam ON/OFF;
   a deflection control circuit that outputs control data, the control data being data for controlling ON/OFF of each beam of the multiple beams;
   a plurality of input/output circuits that each receive input of the control data from the deflection control circuit, and that each output a beam ON/OFF signal to each of the plurality of blankers; and
   a writing controller calculating a first shift amount for each of a plurality of first blocks, and correcting an irradiation position or dose for the multiple beams based on the first shift amount, and performing writing, the plurality of first blocks being obtained by dividing a data path based on at least either one of a plurality of input/output circuits and a plurality of wiring groups, the data path being a path for inputting the control data, the plurality of wiring groups each including a plurality of pieces of wiring connected to the plurality of input/output circuits and grouped together based on inter-wiring distance, the first shift amount being a shift amount due to at least one of an electric field and a magnetic field for each of the plurality of first blocks.

7. The apparatus according to claim 6, wherein the writing controller calculates the first shift amount for each of the plurality of first blocks based on a circuit current, the circuit current including a power current and an operating current, the operating current being dependent on a transfer size or transfer time of the control data to be transferred to each of the plurality of input/output circuits.

8. The apparatus according to claim 6, wherein the writing controller divides a cell array into a plurality of second blocks, acquires a dose distribution or a blanking distribution for each of the plurality of second blocks, calculates a second shift amount for each of the plurality of second blocks from the dose distribution or the blanking distribution, and corrects the irradiation position or the dose for the multiple beams based on the first shift amount or the second shift amount.

9. The apparatus according to claim 8, wherein the writing controller calculates a shift amount for the cell array as a whole, and rotation, enlargement, or distortion of a beam shape of the multiple beams based on the first shift amount or the second shift amount, and corrects the beam shape.

10. The apparatus according to claim 6, wherein the writing controller determines a shift amount for the blanking aperture array substrate as a whole by linear combination of the first shift amount calculated for each of the plurality of first blocks, and corrects the irradiation position or the dose for the multiple beams based on the determined shift amount.

11. A computer-readable recording medium storing a program, the program causing a control computer of a multi-charged-particle-beam writing apparatus to execute the steps of:
   dividing a data path into a plurality of first blocks based on at least either one of a plurality of input/output circuits and a plurality of wiring groups, and calculating a first shift amount for multiple beams for each of the plurality of first blocks, the data path being a path for inputting control data to a cell array on a blanking aperture array substrate, the control data being data for controlling ON/OFF of each beam of the multiple beams, the plurality of wiring groups each including a plurality of pieces of wiring connected to the plurality of input/output circuits and grouped together based on inter-wiring distance, the first shift amount being a shift amount due to at least one of an electric field and a magnetic field for each of the plurality of first blocks; and
   correcting an irradiation position or a dose for the multiple beams based on the first shift amount.

12. The computer-readable recording medium according to claim 11, wherein the program causes the control computer to execute the step of, calculating the first shift amount for each of the plurality of first blocks based on a circuit current, the circuit current including a power current and an operating current, the operating current being dependent on a transfer size or transfer time of the control data to be transferred to each of the plurality of input/output circuits.

13. The computer-readable recording medium according to claim 11, wherein the program causes the control computer to execute the steps of:
   dividing the cell array into a plurality of second blocks, and acquiring a dose distribution or a blanking distribution for each of the plurality of second blocks;
   calculating a second shift amount for each of the plurality of second blocks from the dose distribution; and
   correcting the irradiation position or the dose for the multiple beams based on the first shift amount or the second shift amount.

14. The computer-readable recording medium according to claim 13, wherein the program causes the control computer to execute the step of calculating a shift amount for the cell array as a whole, and rotation, enlargement, or distortion of a beam shape of the multiple beams based on the first shift amount or the second shift amount, and correcting the beam shape.

15. The computer-readable recording medium according to claim 11, wherein the program causes the control computer to execute the step of determining a shift amount for the blanking aperture array substrate as a whole by linear combination of the first shift amount calculated for each of the plurality of first blocks, and correcting the irradiation position or the dose for the multiple beams based on the determined shift amount.

* * * * *